US008138749B1

(12) United States Patent  
Paranjape et al.

(10) Patent No.: US 8,138,749 B1
(45) Date of Patent: Mar. 20, 2012

(54) OPTICAL IMAGING AND PATTERNING BASED ON A MAGNETICALLY CONTROLLED FERROFLUID

(75) Inventors: Makarand Paranjape, Silver Spring, MD (US); Vincent P. Spinella-Mamo, Boca Raton, FL (US)

(73) Assignee: Georgetown University, Washington, DC (US)

( * ) Notice: Subject to any disclaimer, the term of this patent is extended or adjusted under 35 U.S.C. 154(b) by 618 days.

(21) Appl. No.: 12/237,325

(22) Filed: Sep. 24, 2008

Related U.S. Application Data

(60) Provisional application No. 61/060,115, filed on Jun. 9, 2008.

(51) Int. Cl.
*G01B 7/14* (2006.01)
(52) U.S. Cl. .................................. 324/207.16; 324/215
(58) Field of Classification Search .................. None
See application file for complete search history.

(56) References Cited

U.S. PATENT DOCUMENTS

| 6,776,118 | B2 * | 8/2004 | Schleier-Smith | 118/50.1 |
| 2006/0041182 | A1 | 2/2006 | Forbes et al. | |
| 2006/0197052 | A1 * | 9/2006 | Pugel | 252/62.55 |
| 2007/0215553 | A1 | 9/2007 | Yellen et al. | |
| 2007/0224517 | A1 | 9/2007 | Yellen et al. | |

OTHER PUBLICATIONS

Yellen, "Magnetically Programmable Transport and Assembly of Colloidal Particles", Drexel University, Aug. 2004.
Yellen, et al., Ferrofluid lithography, Nanotechnology 15 (2004) S562-S565.
Choi et al., "Simulation of Hydrostatical Equilibrium of Ferrofluid Subject to Magneto-static Field", IEEE Transactions on Magnetics, vol. 44, No. 6, Jun. 2008.
Laird et al., "Ferrofluid Based Deformable Mirrors—A New Approach to Adaptive Optics Using Liquid Mirrors", 2001.
Brousseau, "Comportement spatial de miroirs deformables a base de liquide magnetique", Universite Laval Quebec, 2008.
Yellen et al., "Programmable Self-Aligning Ferrofluid Masks for Lithographic Applications", IEEE Transactions of Magnetics, vol. 40, No. 4, Jul. 2004, pp. 2994-2996.

* cited by examiner

Primary Examiner — Minh N Tang
(74) Attorney, Agent, or Firm — McKeon, Meunier, Carlin & Curfman, LLC

(57) ABSTRACT

Methods, systems, and apparatus for optical imaging and patterning based on a magnetically controlled ferrofluid are described. One such system includes a substrate and an active region including multiple magnetic field generators. The active region is positioned adjacent to the substrate. The system includes a ferrofluid positioned on the substrate adjacent the active region within a range of a magnetic field of the multiple magnetic field generators. The ferrofluid is distributed across multiple ferrofluid regions. Each magnetic field generator is aligned with a corresponding ferrofluid region.

16 Claims, 11 Drawing Sheets

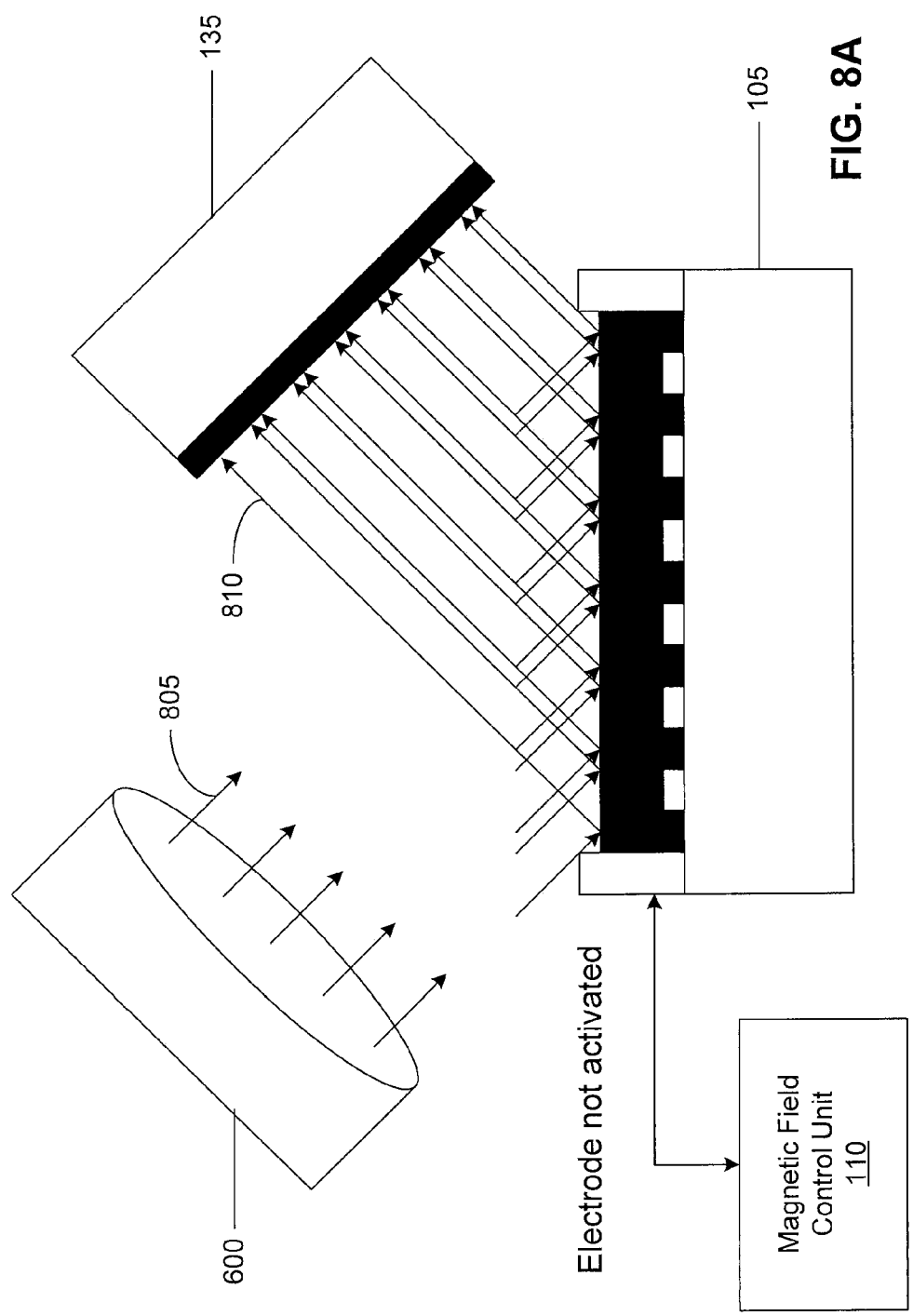

OPTICAL IMAGING AND PATTERNING BASED ON A MAGNETICALLY CONTROLLED FERROFLUID

CROSS-REFERENCE TO RELATED APPLICATIONS

This application claims priority to U.S. Provisional Patent Application No. 61/060,115, entitled Ferrofluids-based Microelectromechanical Systems for Photolithography, to inventors Makarand Paranjape and Vincent P. Spinella-Mamo, which was filed on Jun. 9, 2008. The specification of the above application is incorporated herein by reference in its entirety.

BACKGROUND

This application relates to techniques, apparatus, and systems associated with ferrofluids.

A ferrofluid is a fluid including paramagnetic iron oxide particles suspended in a surfactant-containing liquid. A magnetic field can be applied to a ferrofluid to control the spatial distribution of the suspended magnetic particles to form a desired pattern.

SUMMARY

This specification describes technologies relating to optical applications of ferrofluid-based systems. In one example, light, that is incident on a ferrofluid surface, interacts with the liquid and the suspended magnetic particles differently. Thus, a magnetically controlled ferrofluid can be used to manipulate light for various applications based on such interactions between light and the ferrofluid. For example, photolithography and display systems are based on use of modulated light beams and such light modulations can be achieved by using a magnetically controlled ferrofluid.

In one aspect, a system includes a substrate and an active region including multiple magnetic field generators. The active region is positioned adjacent the substrate. Also, the system includes a ferrofluid positioned on the substrate adjacent the active region within a range of a magnetic field of the multiple magnetic field generators. The ferrofluid is distributed across multiple ferrofluid regions. Each magnetic field generator of the multiple magnetic field generators is aligned with a corresponding ferrofluid region. Activating a magnetic field generator in the active region causes a non-planar pattern to be formed on a region of the ferrofluid aligned with the activated magnetic field generator.

This, and other aspects, can include one or more of the following features. The active region can be positioned on a surface of the substrate. The active region can be formed by patterning the multiple magnetic field generators on the surface of the substrate. Each magnetic field generator of the multiple magnetic field generators can be an inductor including a wire. Each magnetic field generator can be configured to generate a corresponding magnetic field upon receiving a current signal. The system can further include a control unit to apply a control signal to the active region. The control signal can activate one or more magnetic field generators to generate a magnetic field that can cause corresponding one or more regions on the ferrofluid to deform into one or more non-planar patterns. The system can further include an optical source to provide a collimated optical beam incident on the ferrofluid. An intensity of portions of the collimated optical beam reflected by the ferrofluid onto an exposure surface can be substantially same as an intensity of the collimated optical beam incident on the ferrofluid, except that an intensity of portions of the collimated optical beam reflected by the one or more non-planar patterns can be less than a threshold intensity required to affect the exposure surface. The collimated optical beam can be ultra-violet radiation and the exposure surface can include photoresist. Regions of the photoresist that receive portions of the ultra-violet radiation reflected by the ferrofluid other than the one or more regions deformed into non-planar patterns can react to the ultra-violet radiation. The collimated optical beam can be white light and the exposure surface can be a projection screen. The one or more magnetic field generators that can be activated to generate the magnetic field can be selected based on an image including one or more features corresponding to the one or more magnetic field generators. The system can include a computer system to transfer the one or more features in the image to the electrode to activate the one or more magnetic field generators. The system can further include a container positioned on the substrate to retain the ferrofluid. The substrate can be glass.

In another aspect, a method includes applying a magnetic field to multiple ferrofluid regions in a ferrofluid to cause multiple non-planar patterns to form on a surface of the ferrofluid. Incident light is directed onto the surface that includes the multiple non-planar patterns to produce a reflection of the incident light off the multiple non-planar patterns that is different from a reflection of the incident light off regions of the surface without the non-planar patterns.

This, and other aspects, can include one or more of the following features. The method can further include controlling the magnetic field to make an intensity of the light reflected by a non-planar pattern to be substantially less than an intensity of the light reflected by the regions of the surface without the non-planar pattern. The method can further include positioning an active region including multiple magnetic field generators adjacent the ferrofluid, and activating the multiple magnetic field generators to apply the magnetic field to portions of the ferrofluid to form the multiple non-planar patterns. Activating the multiple magnetic field generators can further include applying a control signal to the multiple magnetic field generators. Removing the magnetic field can cause the multiple non-planar surfaces to become substantially planar. The magnetic field can include multiple local magnetic field corresponding to the ferrofluid regions of the ferrofluid. Each local magnetic field can cause the corresponding ferrofluid region to form a corresponding non-planar pattern. The light incident on the ferrofluid can be a collimated beam of ultra-violet radiation. The light incident on the ferrofluid can be a collimated beam of white light.

In another aspect, a method includes receiving light on a surface of a ferrofluid. The surface includes multiple non-planar ferrofluid regions formed by applying a magnetic field to the multiple non-planar ferrofluid regions. The light reflected by the surface of the ferrofluid is caused to be incident on an exposure surface configured to react when light of an intensity is incident upon the exposure surface. Portions of the light reflected by the non-planar ferrofluid regions do not retain intensity sufficient to cause a corresponding plurality of second regions on the exposure surface to react.

This, and other aspects, can include one or more of the following features. The ferrofluid can include multiple substantially planar-regions to reflect the light. Light reflected by the multiple substantially planar-regions can retain intensity sufficient to cause a corresponding multiple third regions on the exposure surface to react. The method can further include magnifying the light reflected by the surface of the ferrofluid before causing the light to be incident on the exposure surface.

In another aspect, a method includes positioning an active region on a substrate. The active region includes multiple magnetic field generators. A ferrofluid is retained on the substrate adjacent to the active region. The ferrofluid forming a ferrofluid surface is positioned within a range of a magnetic field generated by the multiple magnetic field generators. One or more magnetic field generators are activated to generate a magnetic field causing non-planar patterns to be formed at one or more regions on the ferrofluid surface. Incident light is received on the surface of the ferrofluid including the one or more regions including the non-planar patterns. An intensity of portions of the incident light reflected by the one or more regions including the non-planar patterns decreases to less than a threshold intensity required to expose an exposure surface that receives the reflected light.

This, and other aspects, can include one or more of the following features. The electrode can be patterned on the substrate by photolithography. The method can further include positioning a container on the substrate to retain the ferrofluid. The active region can be in contact with the ferrofluid. Activating one or more magnetic field generators can include transferring an image to the active region, the image including features at locations corresponding to locations of the one or more magnetic field generators on the active region, and applying a control signal to the locations of the features, the control signal causing the one or more magnetic field generators at the corresponding locations on the active region to generate a magnetic field. The image can be a bitmap image. The method can further include transferring the image using a computer system. The control signal can be a current. The multiple magnetic field generators can be aligned with a corresponding multiple regions on the ferrofluid surface such that activating a first magnetic field generator can cause a non-planar pattern to be formed at a first region aligned with the first magnetic field generator.

In another aspect, an apparatus includes a substrate, an active region positioned adjacent the substrate and comprising a plurality of magnetic field generators, a ferrofluid positioned on the substrate adjacent the active region within a range of and interacting with the magnetic field of the plurality of magnetic field generators, the ferrofluid distributed across a plurality of ferrofluid regions, each magnetic field generator of the plurality of magnetic field generators aligned with a corresponding ferrofluid region, a control unit to apply a control signal to the active region, the control signal activating one or more magnetic field generators to generate a magnetic field that causes corresponding one or more ferrofluid regions to deform into one or more non-planar patterns, and an optical source to provide a collimated optical incident beam incident on the one or more non-planar patterns to produce a reflected beam having a reflection pattern based on the one or more non-planar patterns.

Particular implementations of the subject matter described in this specification can be implemented to realize one or more of the following advantages. The system can be applied as a substitute for masks in photolithographic techniques. The system enables instantaneously designing an image and transferring the image to a ferrofluid-based system that serves as a mask. Such mask designs can be altered on-the-fly. This enables applying a separate exposure design to multiple photoresist layers. Errors to mask designs can be instantaneously corrected. The price and time required to generate conventional photolithographic masks can be significantly reduced. This enables rapid prototyping in microelectromechanical (MEMS) systems. Also, the systems and techniques described here can negate the need to employ high temperatures or chemical solvents while combining mask formation and material deposition in a single step. In applications where white light is used, these systems can serve as a replacement for digital light processing (DLP) technology because these systems can include fewer moving parts that are faster, cheaper, and more durable. This can result in cheaper television sets and projector-based optical systems.

The details of one or more implementations of the specification are set forth in the accompanying drawings and the description below. Other features, aspects, and advantages of the specification will become apparent from the description, the drawings, and the claims.

BRIEF DESCRIPTION OF THE DRAWINGS

FIG. 8A is a schematic of an example ferrofluid-based system when the active region is not activated.

Like reference numbers and designations in the various drawings indicate like elements.

DETAILED DESCRIPTION

Figure 1:
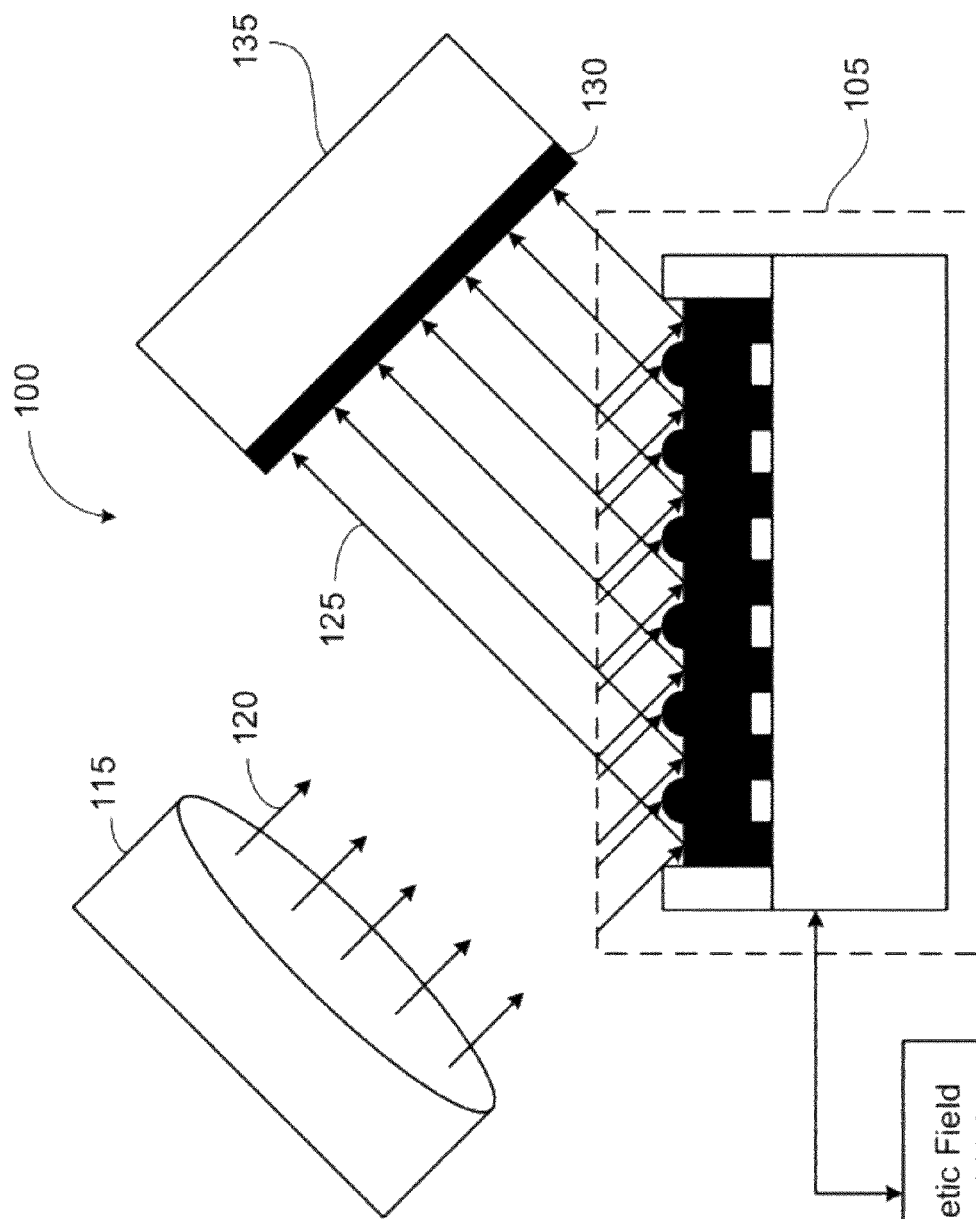
FIG. 1 is a schematic of an example system for selectively exposing regions of an exposure surface.

FIG. 1 is a schematic of an example system 100 based on a magnetically controlled ferrofluid. The system 100 includes a ferrofluid-based system 105 that includes a container that holds a ferrofluid, and a magnetic field control unit 110 operatively coupled to the ferrofluid-based system 105 to apply a magnetic field to the ferrofluid. The magnetic field control unit 110 controls the applied magnetic field, for example, the spatial distribution of the magnetic field. A light source 115 is provided to generate an optical beam 120 having a uniform beam pattern. For example, the light source provides a collimated beam 120. The beam 120 is directed to the ferrofluid in the ferrofluid-based system 105. The magnetic field control unit 110 is used to produce patterns on the surface of the ferrofluid. The patterned ferrofluid reflects the beam 120 to produce a reflected beam 125 that is directed to an exposure surface 130. The ferrofluid-based system 105 can transfer the pattern of the suspended magnetic particles in the ferrofluid onto the exposure surface 130 using a reflected optical beam 125 that carries the pattern of the ferrofluid surface as an optical image. The exposure surface 130 can be in various configurations depending on the specific uses of the optical image in the reflected beam 125.

In some implementations, the exposure surface 130 can be attached to a substrate 135 that is to be patterned via photolithography. In photolithography, optical beams are used to selectively remove parts of a thin film coated on a surface of a substrate. Once the thin films are removed, regions of the substrate surface are exposed and made available for microfabrication processes, for example, etching. In certain photolithography operations, masks are used to selectively remove parts of the thin film.

A mask is a film that includes transparent regions that correspond to regions on the thin film that need exposing. The mask is aligned over the thin film surface, and light, for example, ultra-violet radiation, from a source is incident on the mask. Regions on the thin film that lie directly beneath the transparent regions of the mask are exposed to the incident light while other regions are not. Depending on the nature of the thin film, the exposed regions can be removed without removing the unexposed regions or vice versa.

In lieu of a mask for patterning a surface of a substrate, the system 100 can be configured as a ferrofluid-based photolithography system that uses the magnetically controlled ferrofluid as a master template to generate a desired pattern to be transformed to the exposure surface 130 of the substrate 135. To do so, the ferrofluid-based system 105 receives the optical beam 120, which is incident light, from the light source 115. The ferrofluid-based system 105 is manipulated using the magnetic field control unit 110 to form patterns on the ferrofluid surface. The reflected beam 125 from the ferrofluid surface to the exposure surface 130 transfers the ferrofluid surface pattern to the exposure surface 130. The material of the exposure surface 130 reacts under illumination of the reflected beam 125, exposing regions of the substrate 135 that are to be patterned.

Figure 2A:
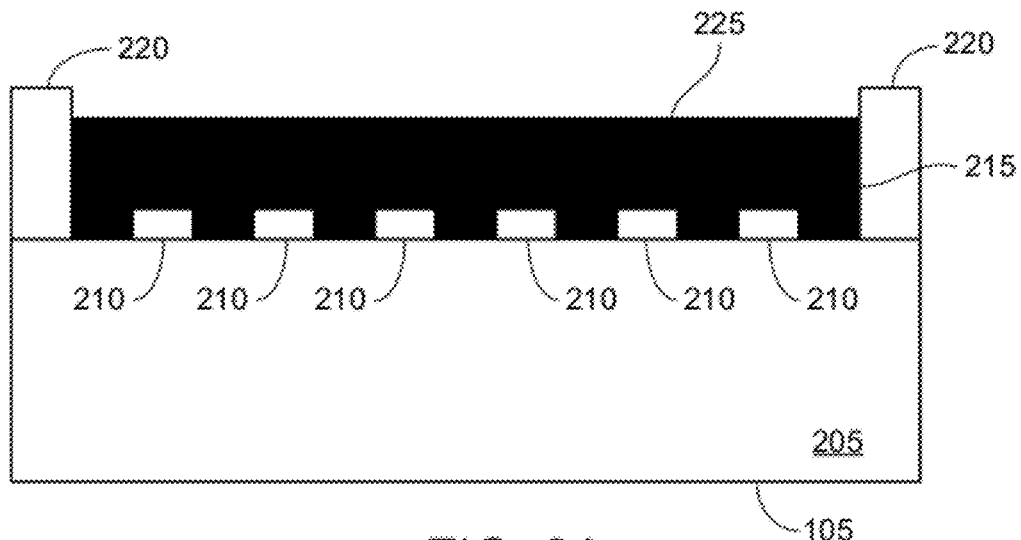
FIGS. 2A and 2B are schematics of an example ferrofluid-based system.

FIG. 2A is a schematic of an example ferrofluid-based system 105. The system 105 includes a substrate 205 manufactured using a material that has properties suitable for application in photolithography. The substrate 205 can be manufactured using glass in some implementations and using plastic in others. In general, the substrate 205 can be manufactured using any material that has a high absorptivity in the optical region of operation, for example, in the ultraviolet wavelength region. Multiple magnetic field generators 210 can be positioned on a surface of the substrate. For example, the multiple magnetic field generators 210 can be patterned on the surface of the substrate by photolithographic techniques. Each magnetic field generator 210 can be manufactured using a wire made from a suitable material, for example, aluminum. In some implementations, the aluminum wires are patterned on the surface of a glass substrate by following the steps below:

1. Clean 25 mm×75 mm microscope slides with an acetone scrub, ethanol scrub, deionized (DI) water rinse, nitrogen ($N_2$) dry;
2. Thermally evaporate 150 nm of aluminum onto slides;
3. Spin positive photoresist (offered by Shipley Corporation, Marlboro, Mass.) onto slides for 45 seconds at 4000 rpm;
4. Pre-expose bake for 1 hour at 90° C.;
5. Expose to ultra-violet radiation for 4 seconds;
6. Develop in CD-30, a TMAH-based developer;
7. Etch aluminum with the following: phosphoric acid ($H_3PO_4$):nitric acid ($HNO_3$):Water ($H_2O$) in the volumetric ratio 8:1:1;
8. Remove resist with acetone rinse, DI rinse, $N_2$ dry;
9. Spin photoresist (SU-8) (offered by MicroChem Corp, Newton, Mass.) 100 for 10 s @ 500 rpm followed by 30 s @ 3000 rpm;
10. Pre-expose bake 65° C./15 minutes→95° C./30 minutes→23° C.;
11. Ultra-violet radiation exposure for 20 seconds at 16.5 $mW/cm^2$;
12. Post-expose bake 65° C./1 min→95° C./min→23° C.;
13. Develop in SU-8 (offered by MicroChem. Corp., Newton, Mass.) developer for 15 minutes;
14. Ethanol rinse, $N_2$ dry.

In addition to patterning the multiple magnetic field generators 210 on the surface of the substrate 205, leads to the field generators 210 can also be patterned on the substrate 205. The patterned leads are used to provide control signals, for example, current signals, to each magnetic field generator. To do so, the patterned leads are operatively coupled to a magnetic field control unit 110, for example, through an electrode that will be described later. In some implementations, multiple magnetic field generators are arranged to form an active region, as explained below. The magnetic field generator can include multiple loops of wire, each loop of wire of diameter in the micron range. In some implementations, the diameter of the wire can be substantially 30 μm, while in others, the diameter can be lower, for example, 2 μm. The multiple loops of wire can be patterned as an array to form the active region.

In some implementations, the dimension of the patterns formed on the surface of the ferrofluid under the effect of the magnetic field applied by the magnetic field control unit 110 depends on the diameter of wire in the active region. For example, the magnetic field control unit 110 is operatively coupled between two ends of a wire forming the magnetic field generator 210. When the magnetic field control unit 110 applies a voltage between the two ends of the wire, a current transmitted through the wire causes the generation of the magnetic field that extends in a region in space surrounding the wire. The magnetic field control unit 110 is configured to control the voltage supplied across arrays of loops of wire, and in turn to control current drawn and the magnetic field generated by the magnetic field generators 210.

Control signals from the magnetic field control unit 110 are applied to one or more magnetic field generators 210 to control the ferrofluid 215 in the system 105. In some implementations, the ferrofluid 215 includes nanoparticles of iron oxides suspended in surfactants. The surfactant acts to keep the nanoparticles from agglomerating. The nanoparticles can be paramagnetic, meaning that the nanoparticles have no native magnetic dipole, but are highly susceptible when placed in an external magnetic field.

In some implementations, the system 105 can include a container 220 to retain the ferrofluid 215 on the surface of the substrate 205. For example, subsequent to patterning the aluminum wires on the substrate, a layer of photoresist can be patterned over the aluminum wires. The layer of photoresist can be selectively exposed to ultra-violet (UV) radiation such that the photoresist along the edges of the substrate 205 remain unexposed. Subsequently, the exposed regions of the layer can be developed and removed, leaving the edges to form a container 220 in which the ferrofluid 215 is retained.

In a resting state, the ferrofluid 215 includes a substantially planar surface 225. Light incident on the substantially planar surface 225 is reflected such that the angle of incidence equals the angle of reflection and such that the intensity of reflected light is substantially equal to the intensity of the incident light. In some implementations, in the resting state, no magnetic field is applied to the ferrofluid 215.

Figure 2B:
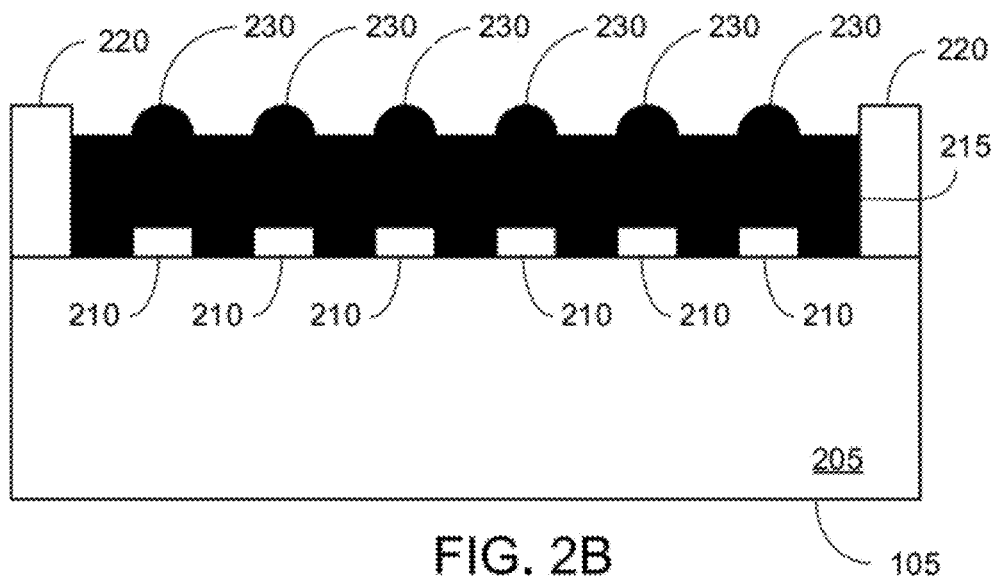

FIG. 2B is a schematic of an example ferrofluid-based system 105. As shown in FIG. 2B, portions of the ferrofluid 215 are in direct contact with the magnetic field generators 210. The magnetic field control unit 110 applies control signals to the multiple magnetic field generators 210 generating a magnetic field at each field generator 210. Due to the paramagnetic nature of the nanoparticles in the ferrofluid 215, the portions of the ferrofluid directly contacting the field generators 210 are displaced when subjected to the magnetic field. When portions of the ferrofluid 215 adjacent to the planar surface 225 are displaced, non-planar patterns 230 are formed. A profile, i.e., shape, of the non-planar pattern 230, depends on the magnetic field generated by the field generator 210, which, in turn, depends on the type of control signal applied to the magnetic field generator 210. The dimensions of the non-planar patterns can be controlled and in some implementations, can be of the order of microns.

When subjected to a magnetic field, the energy of the ferrofluid 215 in the system 105 increases. To reduce the energy of the system, the ferrofluid 215 forms a shape of the magnetic field. Thus, the non-planar patterns 230 on the planar surface 225 of the ferrofluid 215 are manifestations of the local magnetic field applied to each magnetic field generator 210. Upon exceeding a critical value, the ferrofluid forms spikes known as Rosensweig instabilities, which is a function of surface tension, magnetic pressures, and local disturbances. One exemplary technique for applying localized magnetic fields to cause the formation of ferrofluid features is described in "Ferrohydrodynamics," by Ronald E. Rosensweig, (Cambridge University Press, 1985), and can be used in the techniques and devices described here.

Also, although the example system 105 in FIG. 2B shows that the ferrofluid 215 is in direct contact with the magnetic field generators 210, this need not be the case. In some implementations, a layer, for example, a photoresist layer, can separate the magnetic field generators 210 and the ferrofluid 215. As long as all or a portion of the ferrofluid, for example, the portion near the bottom of the container 220, is within a range of the strength of the magnetic field generated by the inductors, the non-planar patterns 230 can be formed on the planar surface 225 of the ferrofluid 215.

The example system 105 shown in FIG. 2B includes six loops of wire, i.e., magnetic field generators 210, to form an active region. When activated, the six loops of wire form six corresponding non-planar patterns 230. Any number of loops of wire can be patterned on the surface of the substrate 205 during the photolithography process to form any number of active regions. By doing so, multiple micron-sized non-planar deformations can be produced on a surface of a ferrofluid positioned over a substrate 205. Not all active regions need be activated at all times. Using the magnetic field control unit 110 and techniques described with respect to FIG. 4, select active regions can be activated. In some implementations, in the same active region, not all loops of wire need be activated at all times. One or more loops of wire can be activated to generate a magnetic field.

In some implementations, to generate non-planar patterns 230 on the ferrofluid surface, control signals are applied to some or all of the multiple magnetic field generators 210 using the magnetic field control unit 110. To do so, each magnetic field generator 210 on each active region can be individually controlled by a corresponding electrode that is operatively coupled to the magnetic field control unit 110. An exemplary device including an active region and multiple electrodes will be described with reference to FIG. 3A.

Figure 3A:
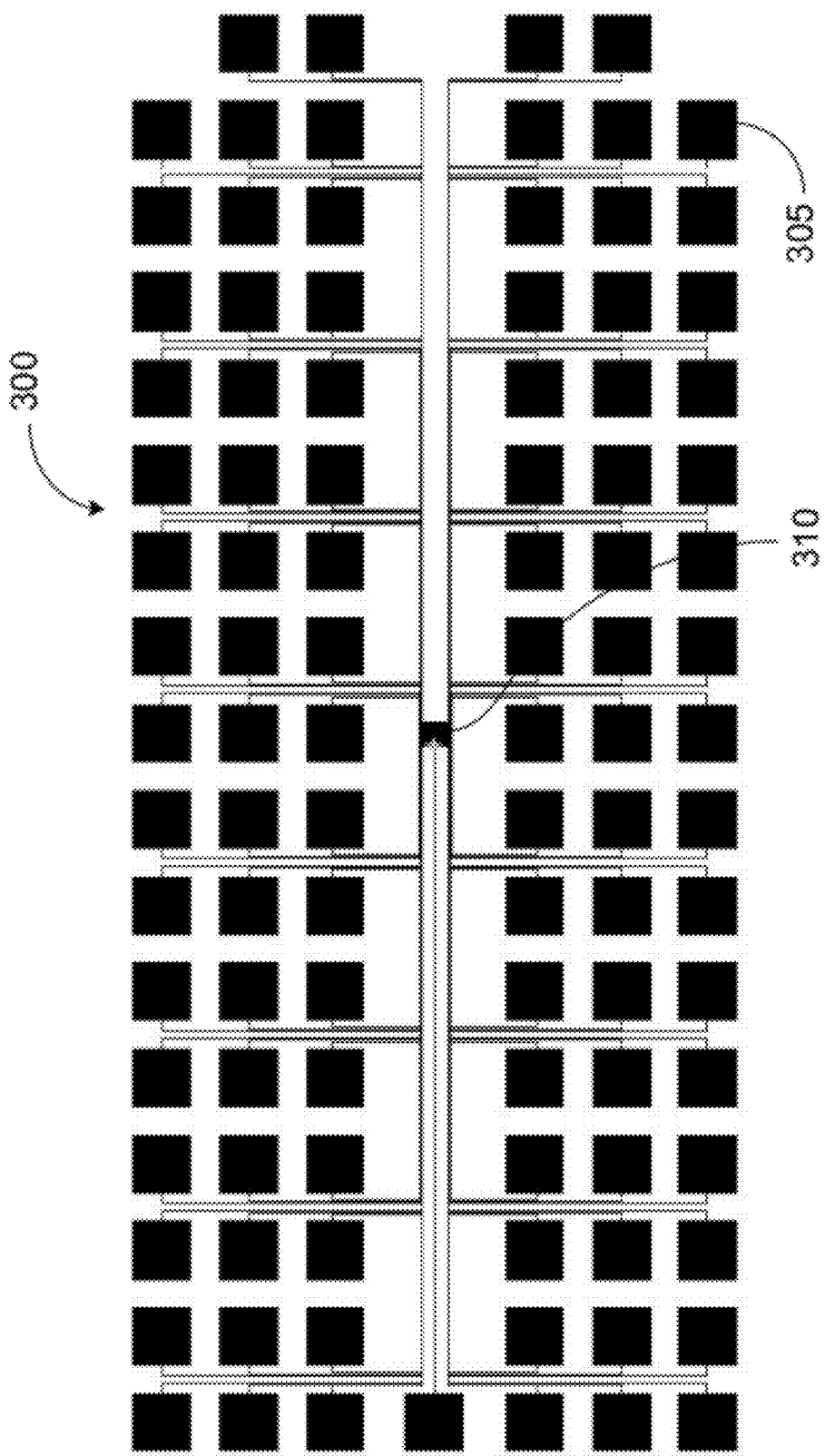
FIG. 3A is a schematic of a device including multiple electrodes connected to an active region.

FIG. 3A is a schematic of a device 300 including multiple electrodes 305 connected to an active region 310. In some implementations, the magnetic field control unit 110 is operatively coupled to the device 300 to provide a control signal to an active region 310 (illustrated as a dark rectangle in FIG. 3A) to generate a corresponding magnetic field. The active region 310 includes multiple magnetic field generators 210 arranged in an array. For example, the inductor wire of a magnetic field generator 210 can be patterned on the substrate 205 in an m×n array. In some implementations, the inductor wires can be 2 μm in diameter and patterned as a 10×10 array. Alternatively, the inductor wires can be 30 μm in diameter, any other diameter, or combinations of wires of different diameters.

In some implementations, each inductor wire in the active region 310 can be controlled by an electrode 305. Each electrode 305, in turn, can be operatively coupled to the magnetic field control unit 110. The ferrofluid can be positioned over the active region 310. To cause non-planar patterns 230 to be formed on the surface of the ferrofluid over the active region 310, some or all the magnetic field generators 210 in the active region 310 can be controlled by corresponding electrodes 305. In some implementations, a single electrode 305 can provide control signals to control more than one magnetic field generator 210 in the active region 310. Individual magnetic field generators 210 in the active region 310 can be controlled using a digital image, for example, a bitmap image, as will be described with reference to FIG. 4.

Figure 3B:
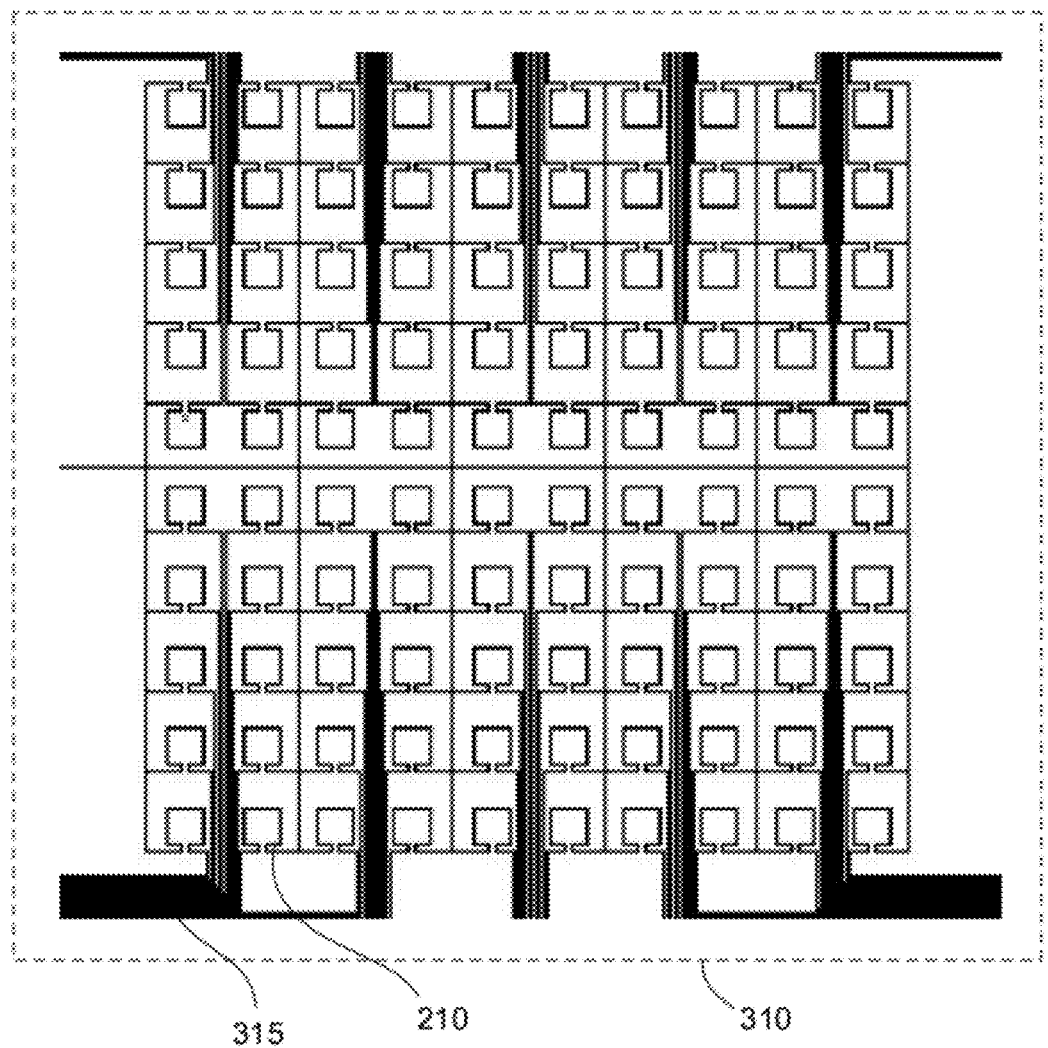
FIG. 3B is a schematic of a close-up view of the active region of the device.

FIG. 3B is a schematic of a close-up view of the active region of the device. As shown in FIG. 3B, multiple magnetic field generators 210 are patterned on the substrate using methods described previously in an array, for example, 10×10 array, to form the active region 310 over which the ferrofluid is placed. The electrodes 305 in the device 300 are operatively coupled to the magnetic field generators 210 as described previously. For example, a wire bundle 315 including multiple wires connected to each magnetic field generator 21 are connected to corresponding multiple electrodes 305. The magnetic field generated by the magnetic field generators 210 in the active region 310 cause non-planar features to be formed on the surface of the ferrofluid placed over the active region 310. The active region 310, illustrated in FIGS. 3A and 3B, represents one such active region 310 that can be patterned on a substrate 205. Using the techniques described here, or using other patterning techniques, multiple active regions can be patterned on the substrate 205. Subsequently, light from a source can be reflected off of the active regions onto an exposure surface, as described previously.

Figure 4:
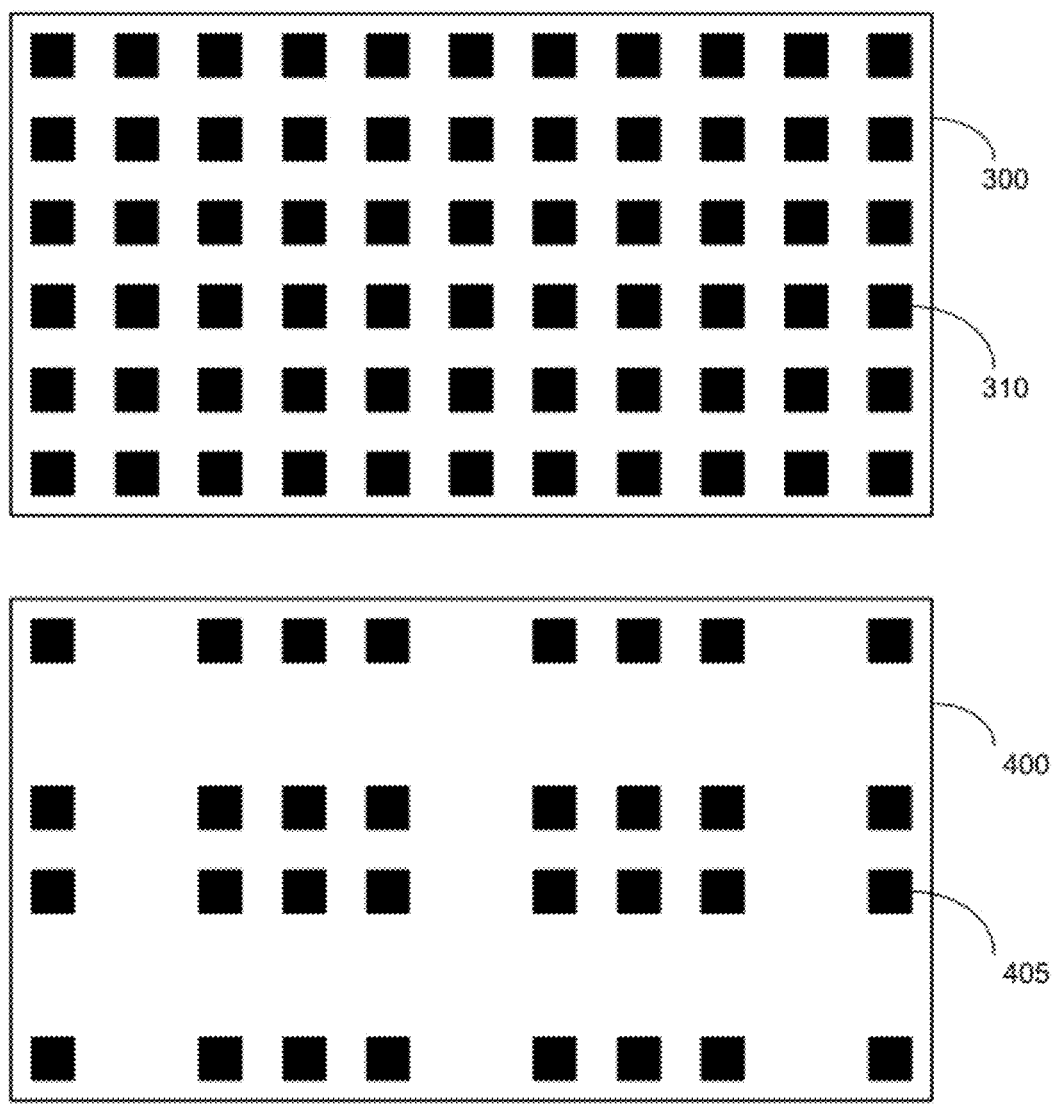
FIG. 4 is an example of an image used to selectively activate active regions.

FIG. 4 is an example of an image 400 used to selectively activate active regions 310. In some implementations, multiple active regions 310, each including multiple magnetic field generators 205, can be included on the device 300. While FIG. 3A illustrated a single active region 310 operatively coupled to multiple electrodes 305, FIG. 4 shows multiple active regions 310, each coupled to multiple electrodes (not shown), arranged on a device 300. To selectively activate some of the active regions 310, control signals can be supplied to the electrodes (not shown) operatively coupled to the active regions 310 that need to be activated.

For example, each active region 310 can be connected to a group of electrodes that collectively control the magnetic field generators in that active region 310. In some implementations, one or more electrodes can be shared by more than one active region 310. For example, a control signal transmitted to an electrode by the magnetic field control unit can be supplied to more than one magnetic field generator 210 in more than one active region 310 to activate the region.

The select active regions 310 can be individually accessed to supply control signals. To do so, an image 400 of the substrate 205 is generated. In some implementations, the image 400 can be a bitmap image created using a computer drawing software, e.g., Microsoft® Paint, offered by Microsoft Corporation (Redmond, Wash.). The image 400 includes multiple features 405, where a location of a feature 405 on the image 400 corresponds to a location of an active region 310 on the device 300. For example, active regions 305 on the device 300 that are to be activated can be drawn in black, while other portions of the image 400 can be white. In other examples, this color scheme can be reversed. In application, device 300 is attached to the substrate 205. The ferrofluid is positioned over the device 300 covering the active regions 310. When select active regions 310 on the device 300 are activated using the magnetic field control unit 110, the ferrofluid positioned over the activated regions undergo transformations under the effect of the local magnetic field of each active region 310 to form non-planar patterns 230.

Figure 5:
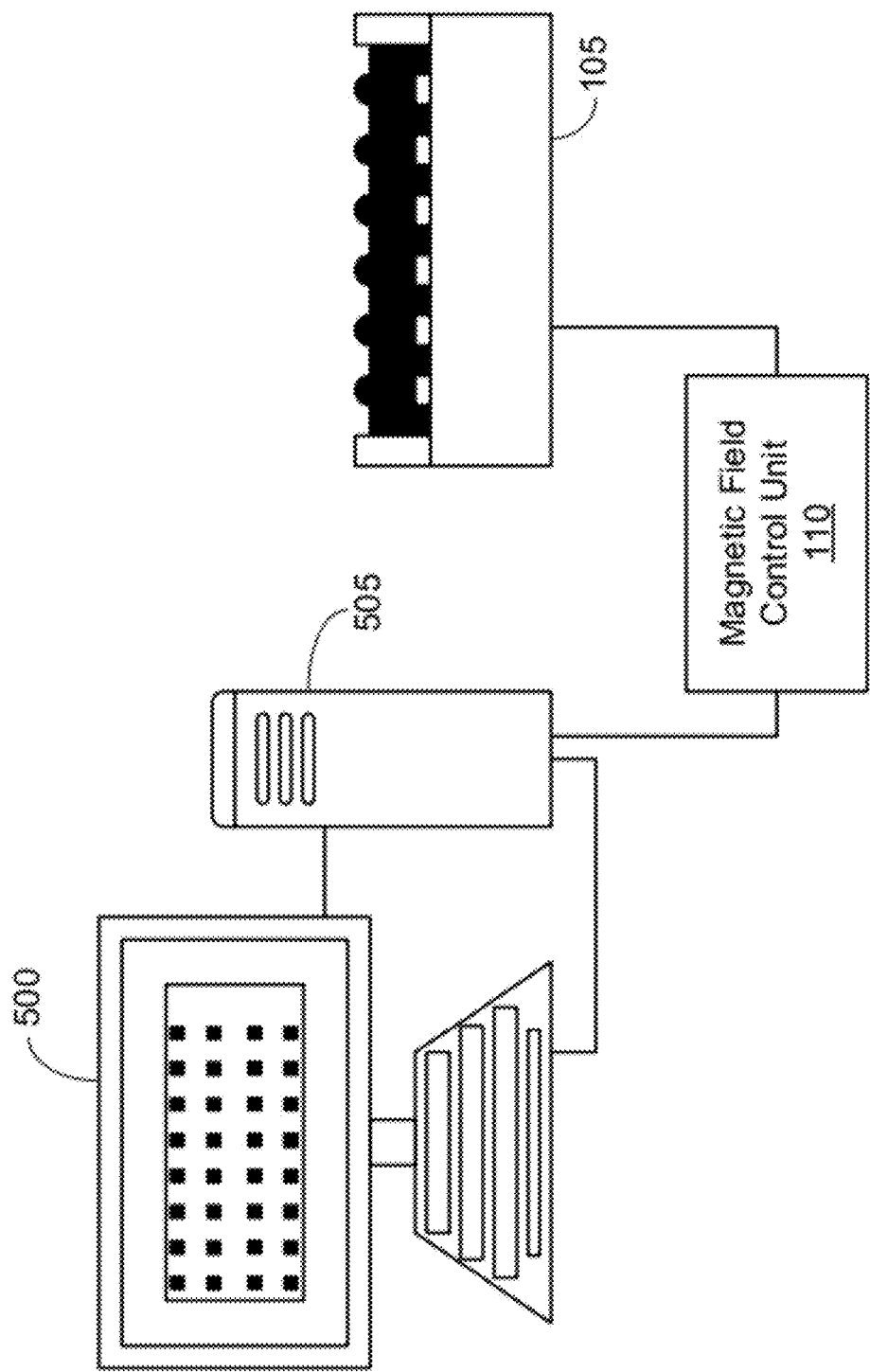
FIG. 5 is a schematic of a computer system operatively coupled to a ferrofluid-based system.

FIG. 5 is a schematic of a computer system 500 operatively coupled to a ferrofluid-based system 105. In some implementations, a user creates an image 400 including features 405 representing active regions 310 on the device 300 that need to be activated, on a computer system 500. The computer system 500 includes a computer 505 including a computer-readable medium on which the image 400 is stored. Subsequently, using the computer 505, the user transfers the image 400 to the substrate 205, in the ferrofluid-based system 105 via the magnetic field control unit 110. In some implementations, the system 105 can be connected via parallel port or other active transfer port on a computer, for example, USB, serial port, and the like. The output of each parallel port is connected to locations illustrated in FIG. 9. In some implementations, a computer program can be used to transfer the image 400 to the substrate 205. An example computer program, written in the computer language, C, is provided below. Other computer languages can be used.

```
#include <time.h>
#include <stdio.h>
#include <unistd.h>
#include <sys/io.h>
#define MAXOR 765
void set_box(int data, int box)
{
   int bank;
   int bankbox;
   if(box>=1&&box<=8) { bank=8; bankbox=box−1; }
   if(box>=9&&box<=16) { bank=16; bankbox=box−9; }
   if(box>=17&&box<=24) { bank=32; bankbox=box−17; }
   if(box>=25&&box<=32) { bank=64; bankbox=box−25; }
   if(box>=33&&box<=40) { bank=128; bankbox=box−33; }
   int base = 0x378;
   int control = base + 2;
   outb(1, control);
   outb(data, base);
   outb(0, control);
   outb(1, control);
   outb(bankbox+bank, base);
   outb(3, control);
   outb(1, control);
}
int powt(int num)
{
   int count;
   int temp = 1;
   for(count = 0; count < num; count++)
      temp *= 2;
   return temp;
}
struct head{
   char bfType[2];
   int bfSize;
   short bfReserved;
   short bfReserved2;
   int bfOffbits;
   int biSize;
   int biWidth;
   int biHeight;
   short biPlanes;
   short bits;
   int biCompression;
   int biSizeImage;
   int biXPelsPerMeter;
   int biYPelsPerMeter;
   int biClrUsed;
   int biClrImportant;
} h;
void readhead(FILE *file, struct head *h)
{
   fread(&h->bfType, 1, 2, file);
   fread(&h->bfSize, 1, 4, file);
   fread(&h->bfReserved, 1, 2, file);
   fread(&h->bfReserved2, 1, 2, file);
   fread(&h->bfOffbits, 1, 4, file);
   fread(&h->biSize, 1, 4, file);
   fread(&h->biWidth, 1, 4, file);
   fread(&h->biHeight, 1, 4, file);
   fread(&h->biPlanes, 1, 2, file);
   fread(&h->bits, 1, 2, file);
   fread(&h->biCompression, 1, 4, file);
   fread(&h->biSizeImage, 1, 4, file);
   fread(&h->biXPelsPerMeter, 1, 4, file);
   fread(&h->biYPelsPerMeter, 1, 4, file);
   fread(&h->biClrUsed, 1, 4, file);
   fread(&h->biClrImportant, 1, 4, file);
}
void operate(FILE *f)
{
   int cx, cy;
   unsigned char c;
   int temp;
   long index;
   int count, counter, alt;
   int dcount;
   int data;
   int box;
   data = 0;
   dcount = −1;
   box = 1;
   index = 0;
   for (cy = 0; cy < h.biHeight; cy++)
   {
      for (cx = 0; cx < h.biWidth; cx++)
      {
         temp = 0;
         fread(&c, 1, 1, f);
         temp += c;
         //temp = 0;
         fread(&c, 1, 1, f);
         temp += c;
         //temp = 0;
         fread(&c, 1, 1, f);
         temp += c;
         alt = h.biHeight − cy;
         //fprintf(stderr, "temp(%d, %d) = %d\n", (cx+1), alt, temp);
         dcount = (cx + h.biHeight * cy + 1);
         if (temp == 0)
         {
            if ((dcount % 8) == 0)
               data += 128;
            else
               data += powt((dcount % 8) − 1);
         }
         if (((dcount % 8) == 0))
         {
            box = (dcount / 8);
//          fprintf(stderr, "data = %d box = %d\n", data, box);
            set_box(data, box);
            data = 0;
         }
      }
      counter = h.biWidth % 4;
      for (count = 0; count < counter; count++)
         fread(&c, 1, 1, f);
```

-continued

```
    }
//  fprintf(stderr, "data = %d box = 13\n", data);
    set_box(data, 13);
    data = 0;
    box++;
  }
int main(int argc, char *argv[ ])
{
    FILE *f1;
    int base = 0x378;
    ioperm(base, 8, 1);
    ioperm(base + 2, 8, 1);
    outb(0, base);
    outb(1, base + 2);
    if (argc != 2)
    {
        fprintf(stderr, "Correct usage is:
\"controlfile.bmp\"\n");
        exit(1);
    }
    f1 = fopen(argv[1], "rb");
    if (f1 != NULL)
    {
        readhead(f1, &h);
        fseek(f1, h.bfOffbits, 0);
    }
    else
    {
        fprintf(stderr, "Could not open file\n");
        exit(2);
    }
    operate(f1);
    fclose(f1);
    return 0;
}
```

In some implementations, the magnetic field control unit 110 can be configured to apply a control signal to magnetic field inductors 305 in the active regions 310 that are positioned at locations corresponding to the features 405 in the image 400. For example, if a black feature 405 is detected in the image 400, then the control unit 110 can apply a voltage signal to the active region 310 located at the corresponding location on the device 300. Applying control signals to an active region 310 includes applying the control signals to the magnetic field generators in the active region 310. If no feature is detected in the image 400, i.e., the image 400 is white, then no voltage signal is applied to the corresponding active region 310 on the device 300. In this manner, the process of transferring the image 400 to the device 300 can include selective activation of magnetic field generators 210 in active regions on the device 300 using the magnetic field control unit 110.

In some implementations, the computer system 500 and the magnetic field control unit 110 can be used to dynamically alter the non-planar patterns that are formed on the surface of the ferrofluid in the ferrofluid-based system 105. As described previously, active regions 310 can be selectively activated using the control unit 110. The activated regions 310 are based on an image in the computer system 500. Multiple images can be uploaded into the computer system 500 and these images can be transferred to the ferrofluid in a sequence. Based on this sequence, the control unit 110 applies control signals to the ferrofluid causing dynamic alteration of the non-planar patterns formed on the ferrofluid surface. In this manner, the image transferred to the reflected beam can be dynamically altered. This dynamic alteration can be used to change the pattern formed on the exposure surface which is illuminated by the image carrying reflected beam.

The use of the ferrofluid-based system 105 described above can be used in various applications including light projection. For example, light from a source can be reflected off a patterned ferrofluid surface onto a screen. By dynamically altering the patterns on the ferrofluid surface, images can be formed on the screen. In some examples, the light can be passed through a color wheel to form color images. These methods of light projection using ferrofluid-based systems can be used as the basis for manufacturing projectors for television.

Figure 6:
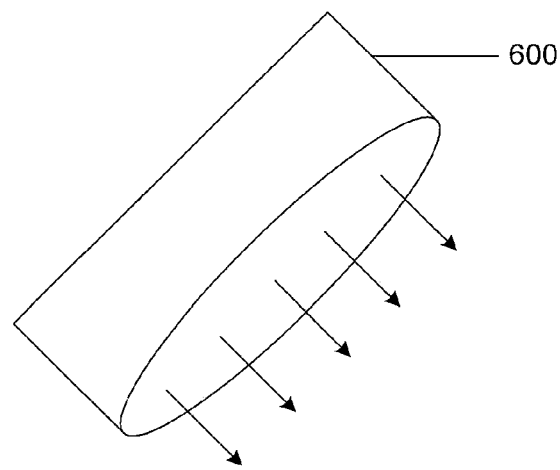
FIG. 6 is a schematic of an example optical source.

FIG. 6 is a schematic of an example optical source 600. The choice of optical source 600 can depend on the intended application of the system 100 shown in FIG. 1. In photolithography applications, the optical source 600 can be a UV light source that emits a collimated beam of ultra-violet radiation. In projection applications, the optical source 600 can be white light source that emits a collimated beam of white light. An example of a UV light source that could be used after collimation is the Lightningcure LC-L1 series available through Hamamatsu, Bridgewater, N.J.

Figure 7:
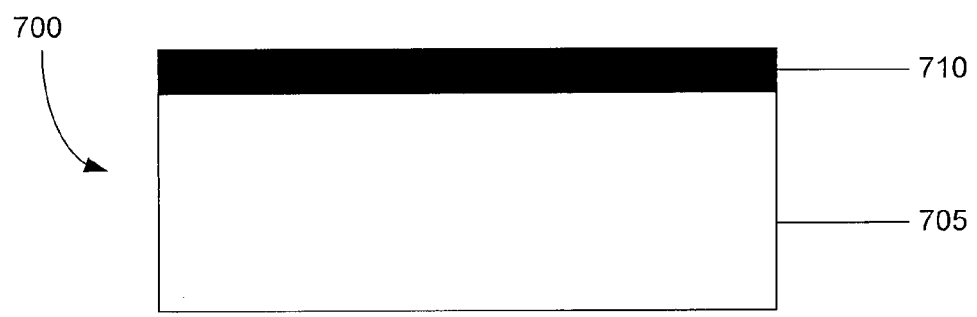
FIG. 7 is a schematic of an example exposure surface.

FIG. 7 is a schematic of an example exposure surface 700. In photolithography implementations, the exposure surface 700 includes a substrate 705 made from a suitable material, for example, glass, polymer, and the like. Such substrates can be etched by appropriate reagents. Other substrates can include polymers, silicon, oxides, nitrides, and the like. The exposure surface 700 includes an exposure layer 710 that can be positive or negative photoresist. In photolithography implementations employing positive photoresist as the exposure layer 710, regions of the exposure layer 710 on which light, for example, UV light from the UV light source 600, is incident, become soluble. In implementations employing negative photoresist, regions of the exposure layer 710, other than the exposed regions, can be developed and removed. In some implementations, the system 100 shown in FIG. 1 can be employed for digital projection of reflected light, for example, for high-definition television. In such implementations, the optical source 600 is a source of collimated white light, and the exposure surface 700 is a screen on which the reflected light is incident.

FIG. 8A is a schematic of an example ferrofluid-based system when the active region is not activated. As described previously, the ferrofluid-based system includes a substrate, an active region including multiple magnetic field generators, and ferrofluid. The active region is positioned adjacent to the substrate. In some implementations, the active region is patterned on the surface of the substrate. The ferrofluid is positioned on the substrate adjacent to the electrode within a range of a magnetic field of the multiple magnetic field generators in the active region. The ferrofluid forms a substantially planar surface. Each magnetic field generator in the active region is aligned with a corresponding region on the substantially planar surface of the ferrofluid.

A schematic of application of the ferrofluid-based system in photolithography is shown in FIG. 8A. The optical source provides a collimated beam of UV light. When the electrode is not activated, the ferrofluid is not subject to any magnetic field and the ferrofluid surface remains substantially planar. Light 805 from the optical source that is incident on the planar surface 815 is reflected to form reflected light 810. The reflected light 810 is incident onto the exposure layer, for example, photoresist layer, on an exposure surface. In such scenarios, all regions of the photoresist layer are exposed to the UV light. The intensity of the light reflected on the planar surface is substantially same as the incident collimated light beam. This means that losses in intensity due to absorption, scattering, and the like, are minimal, and that almost all of the incident optical beam is reflected. Further, the intensity of the reflected UV light is sufficient to cause the regions of the photoresist on the exposure surface to react to the light. In some implementations, the intensity of the incident light can be around 16 mW/cm$^2$. Consequently, the reflected beam can have an irradiance of approximately 16 mW/cm$^2$. In general, the incident beam can have an intensity sufficient to cause the reflected beam to have a sufficient irradiance.

Figure 8B:
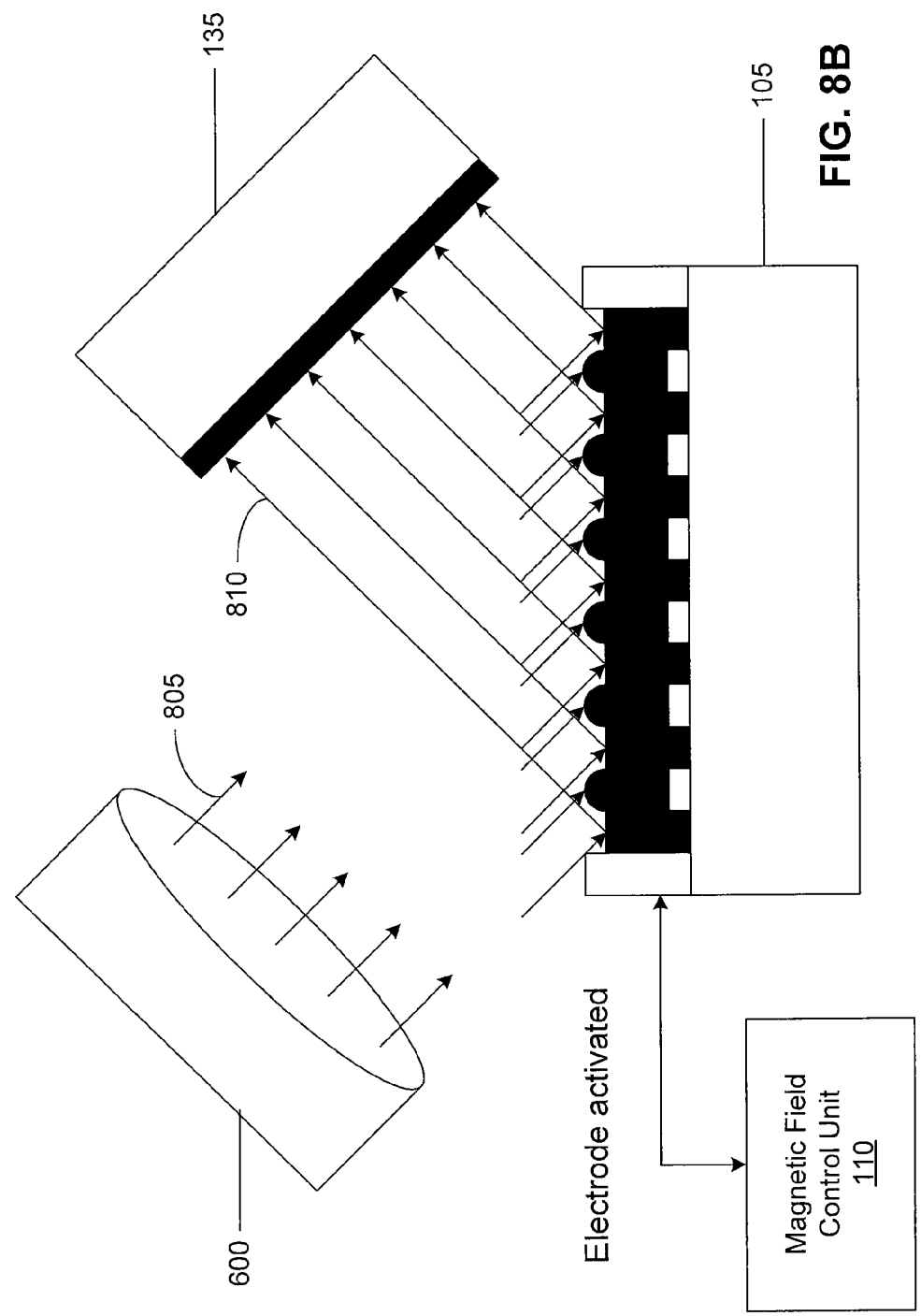
FIG. 8B is a schematic of an example ferrofluid surface when the active region is activated.
Figure 8C:
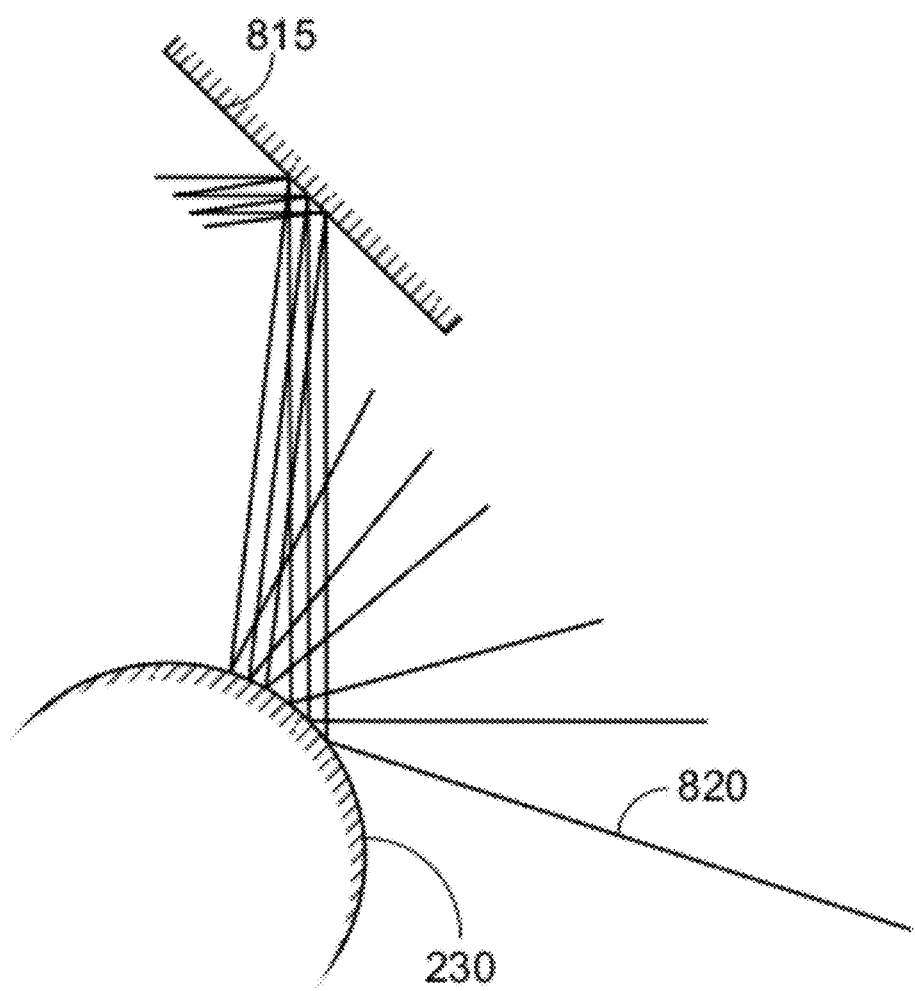
FIG. 8C is a ray-trace illustrating reflection of light off of a non-planar surface.

FIG. 8B is a schematic of an example ferrofluid surface when the active region is activated. When the active region is activated, non-planar patterns are formed on the substantially planar ferrofluid surface, as explained previously. FIG. 8C is a ray-trace illustrating reflection of light off of a non-planar pattern 230. For illustration purposes, FIG. 8C shows a collimated beam of light 820 reflected off of a reflecting surface 815 and incident on the non-planar pattern 230 that is formed on the substantially planar surface 225. Because of the profile of the non-planar pattern 230, the reflected light is no longer collimated. Consequently, the intensity of the incident light is substantially lower than that of the incident light.

In some implementations, the intensity of light reflected off of the non-planar pattern is nearly zero. The profile of the non-planar pattern 230 can be controlled using the magnetic field applied to the ferrofluid such that light reflected off of the non-planar pattern 230 is not reflected upon desired regions of the exposure surface. Alternatively, or in addition, the non-planar pattern 230 can be manipulated such that the intensity of the reflected light is too low to cause the photoresist layer on the exposure surface to react. In this manner, the patterns formed on the surface of the ferrofluid reflect the incident light differently in comparison to portions of the ferrofluid surface on which patterns are not formed. Because the patterns are controlled by the control unit 110, the reflectivity of the optical beam is also controllable using the magnetic field control unit 110. An example of photopolymerization is that of SU-8 100, which requires 20 seconds of UV exposure (at 365 nm wavelength) at 16 mW/cm$^2$ in order to completely polymerize. In order to render the appearance of a beam reflected off of a non-planar pattern 230, a ray-tracing program, such as OSLO (Lambda Research Corporation, Pittsford, N.Y.), can be used.

In photolithography applications, regions of photoresist on the exposure surface are identified. If exposure layer consists of positive photoresist, then the identified regions can be regions that should not be exposed to UV radiation. Alternatively, if the exposure layer consists of negative photoresist, then the identified regions can be regions that should be exposed to UV radiation. In scenarios where the exposure layer is a positive photoresist, a user creates an image of the exposure layer including features that are, for example, black. The locations of the features in the image are chosen based on regions on the exposure layer that should not be exposed to UV radiation.

The user transfers the image to the electrode using methods described previously. Subsequently, the user applies a control signal to the active regions causing non-planar patterns to be formed on the substantially planar surface of the ferrofluid. The locations of the non-planar patterns correspond to the locations of the features on the image. These features, in turn, correspond to regions of photoresist on the exposure layer. The user aligns the optical source, the ferrofluid-based system, and the exposure surface such that UV light from the optical source is incident on the ferrofluid and is reflected onto the photoresist. For example, the user aligns the system using laser which is only needed for occasional calibration. Because light reflected off of the non-planar patterns is either not incident on the photoresist or lacks sufficient intensity to cause the photoresist to react or both, the photoresist is selectively exposed to the reflected UV radiation. The selectively exposed photoresist can be developed and used in photolithography purposes, for example, etching of the substrate in the exposure surface. Similar techniques can be used to selectively expose regions of negative photoresist. In this manner, when the electrode is activated, the ferrofluid-based system serves as a mask to selectively expose regions of photoresist on the exposure surface.

Figure 9:
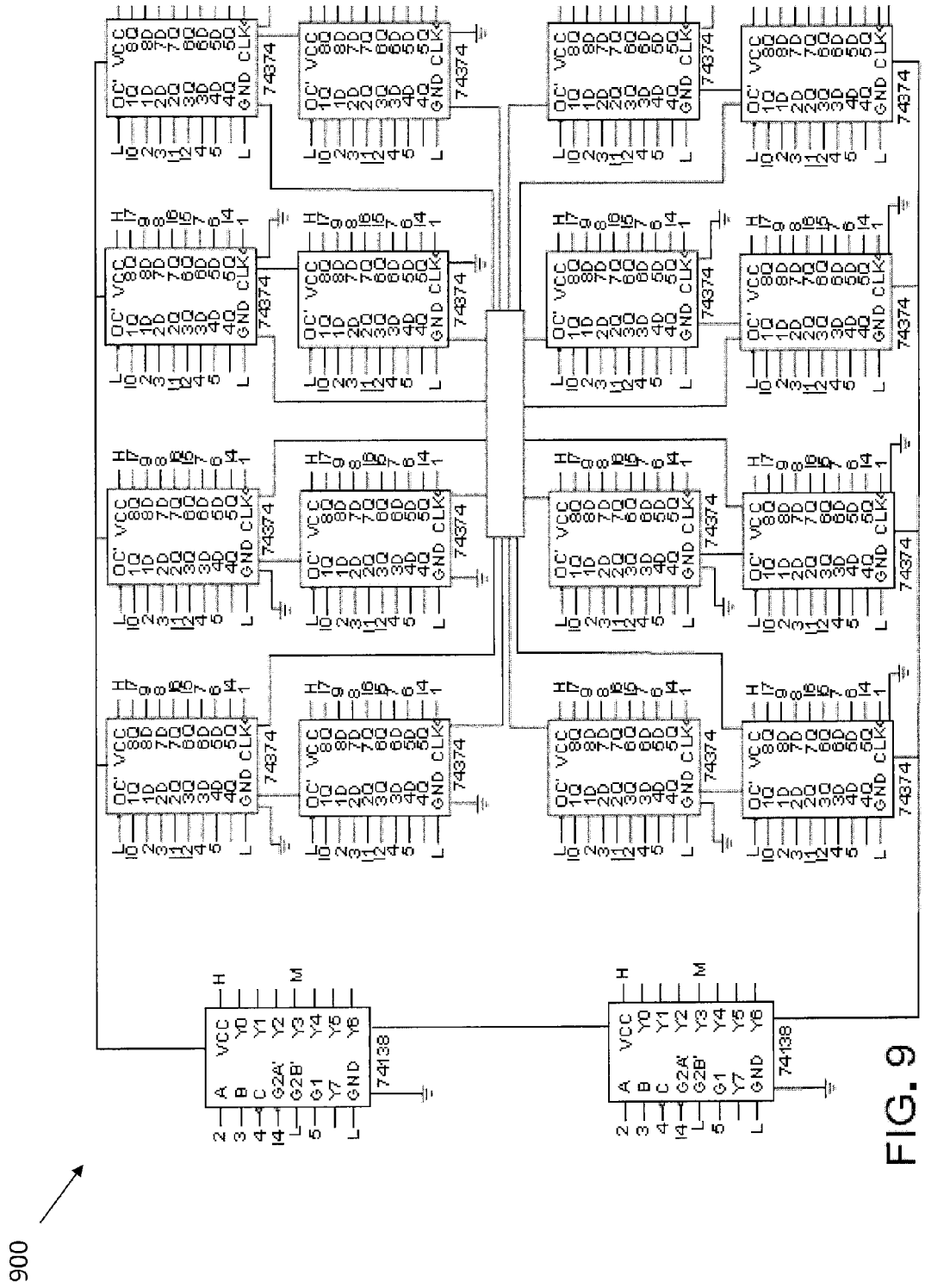
FIG. 9 is a schematic of an example circuit to control an electrode.

FIG. 9 is a schematic of an example circuit 900 to control an electrode. The circuit 900 enables controlling a 10×10 active region array. The active region array includes 100 (10×10) inductors that can be controlled via a parallel port of a computer system. The circuit 900 includes seventeen 74374 chips (octal d-type flip flops) and two 74138 chips (three-to-eight converters) (offered by Jameco Electronics, Belmont, Calif.).

Implementations of the techniques for transferring images to the electrodes can be implemented in digital electronic circuitry, or in computer software, firmware, or hardware, or in combinations of one or more of them.

While this specification contains many specifics, these should not be construed as limitations on the scope of the specification or of what may be claimed, but rather as descriptions of features specific to particular implementations of the specification. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. The separation of various system components in the implementations described above should not be understood as requiring such separation in all implementations.

Thus, particular implementations of the specification have been described. Variations and enhancements of the described implementations and other implementations can be made on what is described and illustrated. For example, the actions as described can be performed in a different order and still achieve desirable results. In some implementations, the electrode is not patterned on the surface of the substrate. Alternatively, the electrode can be patterned on a separate surface and aligned with the substrate. In some implementations, the optical source need not provide a collimated beam of light. In such implementations, the system can include optics to collimate the light provided by the optical source, for example, a parabolic mirror, an optical baffle, an autocollimator, various lenses, and the like.

In some implementations, the optical source can emit a collimated beam of white light. By using white light and a color wheel, a motion picture projector surface can be created. In such implementations, selective portions of the incident light can be reflected onto a projector surface. The light can be passed through a series of optics to enlarge the image for visibility by the naked eye.

In some implementations, magnification optics can be included to receive light reflected off of the ferrofluid surface and to magnify the reflected light onto regions of the exposure surface.

What is claimed is:

1. A system comprising:
    a substrate;
    an active region positioned adjacent the substrate and comprising a plurality of magnetic field generators to generate a magnetic field;
    a ferrofluid positioned on the substrate adjacent the active region within a range of and interacting with the magnetic field of the plurality of magnetic field generators, the ferrofluid distributed across a plurality of ferrofluid regions, each magnetic field generator of the plurality of magnetic field generators aligned with a corresponding ferrofluid region and
    a control unit to apply a control signal to the active region, the control signal activating one or more magnetic field generators to generate a magnetic field that causes corresponding one or more ferrofluid regions to deform into one or more non-planar patterns.

2. The system of claim 1, further comprising an optical source to provide a collimated optical beam incident on the ferrofluid regions, wherein an intensity of portions of the collimated optical beam reflected by the ferrofluid regions surface onto an exposure surface are substantially same as an intensity of the collimated optical beam incident on the ferrofluid regions surface, and wherein an intensity of portions of the collimated optical beam reflected by the one or more non-planar patterns is less than a threshold intensity required to affect the exposure surface.

3. The system of claim 2, wherein the collimated optical beam is ultra-violet radiation and the exposure surface comprises photoresist, and wherein regions of the photoresist that receive portions of the ultra-violet radiation reflected by the ferrofluid regions surface react to the ultra-violet radiation.

4. The system of claim 2, wherein the collimated optical beam is white light and the exposure surface is a projection screen.

5. The system of claim 1, wherein the one or more magnetic field generators that are activated to generate the magnetic field are selected based on an image including one or more features corresponding to the one or more magnetic field generators.

6. The system of claim 5, further comprising a computer system to transfer the one or more features in the image to the electrode to activate the one or more magnetic field generators.

7. A method comprising:
    positioning an active region on a substrate, the active region comprising a plurality of magnetic field generators;
    retaining a ferrofluid on the substrate adjacent to the active region, the ferrofluid forming a ferrofluid surface positioned within a range of a magnetic field generated by the plurality of magnetic field generators;
    activating one or more magnetic field generators to generate a magnetic field causing non-planar patterns to be formed at one or more regions on the ferrofluid surface; and
    receiving incident light on the surface of the ferrofluid including the one or more regions comprising the non-planar patterns, wherein an intensity of portions of the incident light reflected by the one or more regions comprising the non-planar patterns decreases to less than a threshold intensity required to expose an exposure surface that receives the reflected light.

8. The method of claim 7, wherein the electrode is patterned on the substrate by photolithography.

9. The method of claim 7, further comprising positioning a container on the substrate to retain the ferrofluid.

10. The method of claim 7, wherein the active region is in contact with the ferrofluid.

11. The method of claim 7, wherein activating one or more magnetic field generators comprises:
    transferring an image to the active region, the image comprising features at locations corresponding to locations of the one or more magnetic field generators on the active region; and
    applying a control signal to the locations of the features, the control signal causing the one or more magnetic field generators at the corresponding locations on the active region to generate a magnetic field.

12. The method of claim 11, wherein the image is a bitmap image.

13. The method of claim 11, further comprising transferring the image using a computer system.

14. The method of claim 11, wherein the control signal is a current.

15. The method of claim 7, wherein the plurality of magnetic field generators are aligned with a corresponding plurality of regions on the ferrofluid surface such that activating a first magnetic field generator causes a non-planar pattern to be formed at a first region aligned with the first magnetic field generator.

16. An apparatus comprising:
    a substrate;
    an active region positioned adjacent the substrate and comprising a plurality of magnetic field generators;
    a ferrofluid positioned on the substrate adjacent the active region within a range of and interacting with the magnetic field of the plurality of magnetic field generators, the ferrofluid distributed across a plurality of ferrofluid regions, each magnetic field generator of the plurality of magnetic field generators aligned with a corresponding ferrofluid region;
    a control unit to apply a control signal to the active region, the control signal activating one or more magnetic field generators to generate a magnetic field that causes corresponding one or more ferrofluid regions to deform into one or more non-planar patterns; and
    an optical source to provide a collimated optical incident beam incident on the one or more non-planar patterns to produce a reflected beam having a reflection pattern based on the one or more non-planar patterns.

* * * * *